(12) United States Patent
Handa et al.

(10) Patent No.: US 9,484,342 B2
(45) Date of Patent: Nov. 1, 2016

(54) SEMICONDUCTOR APPARATUS

(71) Applicant: Panasonic Intellectual Property Management Co., Ltd., Osaka (JP)

(72) Inventors: Hiroyuki Handa, Osaka (JP); Hidekazu Umeda, Osaka (JP); Satoshi Tamura, Osaka (JP); Tetsuzo Ueda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/938,803

(22) Filed: Nov. 11, 2015

(65) Prior Publication Data

US 2016/0064376 A1 Mar. 3, 2016

Related U.S. Application Data

(63) Continuation of application No. PCT/JP2014/002923, filed on Jun. 3, 2014.

(30) Foreign Application Priority Data

Jun. 5, 2013 (JP) .................................. 2013-118543

(51) Int. Cl.
*H01L 27/06* (2006.01)
*H01L 23/535* (2006.01)
(Continued)

(52) U.S. Cl.
CPC ......... *H01L 27/0629* (2013.01); *H01L 23/535* (2013.01); *H01L 27/0605* (2013.01);
(Continued)

(58) Field of Classification Search
CPC ........... H01L 27/0629; H01L 29/7786; H01L 29/417; H01L 29/7787; H01L 23/535; H01L 29/861; H01L 27/0605; H01L 29/1066; H01L 29/41766; H01L 29/2003; H01L 29/41758; H01L 27/095
See application file for complete search history.

(56) References Cited

U.S. PATENT DOCUMENTS

2008/0191216 A1 8/2008 Machida et al.
2013/0306984 A1 11/2013 Twynam

FOREIGN PATENT DOCUMENTS

JP 61-274324 12/1986
JP 64-039071 2/1989
(Continued)

OTHER PUBLICATIONS

International Search Report of PCT application No. PCT/JP2014/002923 dated Sep. 9, 2014.
(Continued)

*Primary Examiner* — Jarrett Stark
(74) *Attorney, Agent, or Firm* — McDermott Will & Emery LLP

(57) ABSTRACT

A semiconductor apparatus includes a substrate; a nitride semiconductor layer formed on the substrate; a transistor formed on the nitride semiconductor layer, and including a source electrode, a gate electrode, and a drain electrode disposed in this order; and a diode formed on the nitride semiconductor layer, and including an anode electrode and a cathode electrode disposed in this order. The semiconductor apparatus has a transistor/diode pair in which the source electrode, the gate electrode, the drain electrode, the anode electrode, and the cathode electrode are sequentially disposed in this order, and the drain electrode of the transistor and the anode electrode of the diode are connected by a drain/anode common electrode wiring and serve as a common electrode.

20 Claims, 13 Drawing Sheets

(51) Int. Cl.
*H01L 29/778* (2006.01)
*H01L 29/861* (2006.01)
*H01L 29/872* (2006.01)
*H01L 29/205* (2006.01)
*H01L 27/095* (2006.01)
*H01L 29/417* (2006.01)
*H01L 29/20* (2006.01)
*H01L 29/10* (2006.01)

(52) U.S. Cl.
CPC ........... *H01L29/205* (2013.01); *H01L 29/417* (2013.01); *H01L 29/7786* (2013.01); *H01L 29/7787* (2013.01); *H01L 29/861* (2013.01); *H01L 29/872* (2013.01); *H01L 27/0635* (2013.01); *H01L 27/095* (2013.01); *H01L 29/1066* (2013.01); *H01L 29/2003* (2013.01); *H01L 29/41758* (2013.01); *H01L 29/41766* (2013.01); *H01L 2924/0002* (2013.01)

(56) References Cited

FOREIGN PATENT DOCUMENTS

| | | |
|---|---|---|
| JP | 2001-308108 | 11/2001 |
| JP | 2004-241471 | 8/2004 |
| JP | 2008-198735 | 8/2008 |
| JP | 2010-002202 | 1/2010 |
| JP | 2012-186294 | 9/2012 |

OTHER PUBLICATIONS

Wanjun Chen et al., "Single-Chip Boost Converter Using Monolithically Integrated AlGaN/GaN Lateral Field-Effect Rectifier and Normally Off HEMT" IEEE Electron Device Letters, vol. 30, No. 5, May 2009, pp. 430-432.

SEMICONDUCTOR APPARATUS

BACKGROUND OF THE INVENTION

1. Field of the Invention

The present disclosure relates to a semiconductor apparatus having a nitride semiconductor layer.

2. Description of the Related Art

A group-III nitride semiconductor represented by gallium nitride (GaN) has a wide bandgap, that is, gallium nitride (GaN) and aluminum nitride (AlN) are wide-bandgap semiconductors having a wide bandgap width of 3.4 eV and 6.2 eV, respectively at room temperature. In addition, the group-III nitride semiconductor is high in breakdown field intensity, and high in electron saturation speed compared with a compound semiconductor such as gallium arsenide (GaAs) or silicon (Si).

Thus, a filed effect transistor (FET) made of GaN-based compound semiconductor material has been enthusiastically developed as a high-frequency electronic device or a high-output electronic device.

The nitride semiconductor material such as GaN can provide various mixed crystals with AlN or indium nitride (InN), so that a heterojunction can be formed similarly to a conventional arsenic-based semiconductor such as GaAs. Regarding the heterojunction between the nitride semiconductors such as a heterostructure of AlGaN and GaN, high-concentration and high-mobility carriers are generated in a heterojunction interface due to spontaneous polarization and piezoelectric polarization without impurity doping. Therefore, when a transistor or a diode is made of nitride semiconductor, a high-speed operation can be performed. Furthermore, when the transistor and the diode are integrated on the same substrate, a parasitic inductance can be reduced, so that a higher-speed operation and lower-loss operation can be performed.

Thus, as a known apparatus, Non-PTL 1 listed below discloses a nitride semiconductor apparatus in which a transistor and a diode made of nitride semiconductor are integrated on the same substrate to be used for a step-up power factor correction (PFC) circuit.

CITATION LIST

Non-Patent Literature

Non-PTL 1: Wanjun Chen et al., IEEE ELECTRON DEVICE LETTERS, VOL. 30, NO. 5 (May 2009) 430-432.

Hereinafter, a semiconductor apparatus according to a conventional example will be described with reference to FIGS. 12 and 13.

The nitride semiconductor apparatus disclosed in Non-PTL 1 has a planar structure like a step-up circuit shown in FIG. 12 in which the transistor and the diode are formed on the same substrate, and the transistor and the diode are connected with a drain electrode pad and an anode electrode pad being shared. Therefore, a parasitic inductance is inevitably generated in an electrode wiring. When the step-up circuit is configured, an inductance between the transistor and the diode causes a serge voltage to be instantaneously generated between a drain and a source of the transistor, so that the parasitic inductance in the electrode wiring needs to be further reduced. In a step-down circuit shown in FIG. 13, a highly-efficient operation can be performed when a parasitic inductance between the transistor and the diode is reduced.

SUMMARY OF THE INVENTION

In view of the above problem, it is an object of the present disclosure to reduce a parasitic inductance in an electrode wiring between a transistor and a diode in a semiconductor apparatus having a nitride semiconductor layer.

In order to solve the above problem, a semiconductor apparatus according to an aspect of the present disclosure includes a substrate; a nitride semiconductor layer formed on the substrate; a transistor formed on the nitride semiconductor layer, and including a source electrode, a gate electrode, and a drain electrode disposed in this order; and a diode formed on the nitride semiconductor layer, and including an anode electrode and a cathode electrode disposed in this order. The semiconductor apparatus has a transistor/diode pair in which the source electrode, the gate electrode, the drain electrode, the anode electrode, and the cathode electrode are disposed in this order, and the drain electrode of the transistor and the anode electrode of the diode are connected by a drain/anode common electrode wiring for serving as a common electrode.

According to the semiconductor apparatus in the present disclosure, in the semiconductor apparatus including the nitride semiconductor layer, the drain electrode of the transistor and the anode electrode of the diode can be connected in a shortest way, so that the parasitic inductance between the transistor and the diode can be reduced.

DETAILED DESCRIPTION OF THE PREFERRED EMBODIMENTS

Hereinafter, the semiconductor apparatus in the present disclosure will be described with reference to the drawings.

However, a detailed description is occasionally omitted. For example, a detailed description for a well-known matter or a duplicative description for substantially the same configuration is occasionally omitted. Thus, the following description does not become unnecessarily redundant, and the person skilled in the art can easily understand it.

Furthermore, the accompanying drawings and the following description are provided for the person skilled in the art to fully understand the present disclosure, and do not limit the subject matter described in the claims.

First Exemplary Embodiment

Hereinafter, a semiconductor apparatus according to the first exemplary embodiment will be described with reference to FIGS. 1 to 8. A basic structure of the semiconductor apparatus according to the present disclosure is an apparatus structure mainly used for a step-up circuit.

Figure 1:
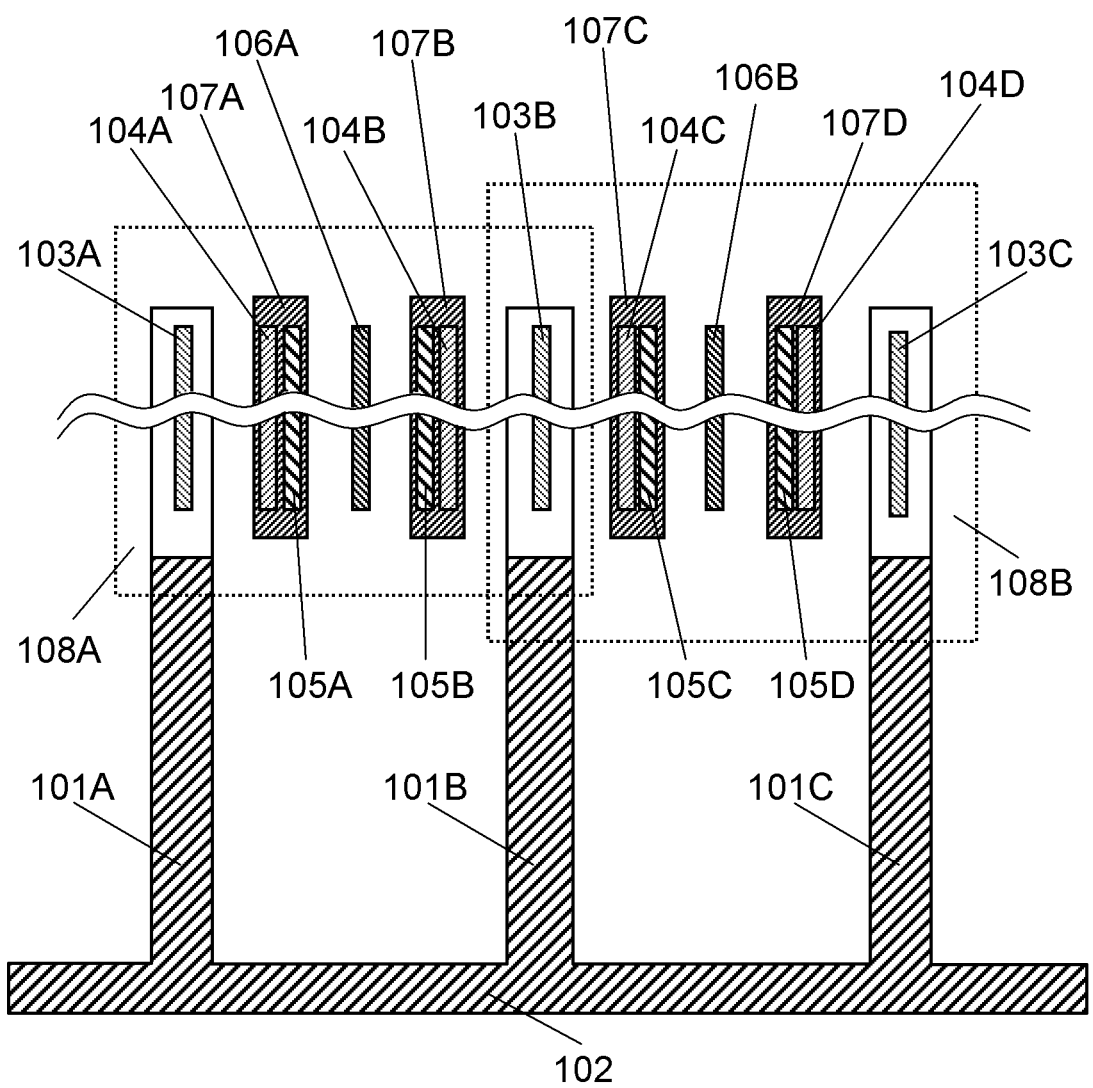
FIG. 1 is a layout diagram of a basic structure of a semiconductor apparatus according to a first exemplary embodiment.

As shown in FIG. 1, the basic structure of the semiconductor apparatus according to the first exemplary embodiment includes transistor/diode group 108A and transistor/diode group 108B in which source electrode 103B and gate electrode 101B are shared. Furthermore, gate electrodes 101A to 101C are disposed so as to surround source electrodes 103A to 103C, respectively. Due to this configuration, a leak current can be reduced when the transistor is in an off-state.

Transistor/diode group 108A includes gate electrodes 101A and 101B, source electrodes 103A and 103B, drain electrodes 104A and 104B, anode electrodes 105A and 105B, and cathode electrode 106A. Drain electrode 104A and anode electrode 105A are connected by drain/anode common electrode wiring 107A, and drain electrode 104B and anode electrode 105B are connected by drain/anode common electrode wiring 107B.

Between gate electrode 101A and gate electrode 101B, drain/anode common electrode wiring 107A, cathode electrode 106A, and drain/anode common electrode wiring 107B are sequentially disposed from a side of gate electrode 101A. In drain/anode common electrode wiring 107A, drain electrode 104A and anode electrode 105A are disposed, and in drain/anode common electrode wiring 107B, drain electrode 104B and anode electrode 105B are disposed. Drain electrode 104A and anode electrode 105A are disposed in drain/anode common electrode wiring 107A so that anode electrode 105A is closer to cathode electrode 106A. Furthermore, drain electrode 104B and anode electrode 105B are disposed in drain/anode common electrode wiring 107B so that anode electrode 105B is closer to cathode electrode 106A. Furthermore, the electrodes are arranged parallel to each other along their longitudinal direction.

An insulating film (not shown, corresponding to insulating layer 124 in FIG. 4) is formed on drain electrode 104A and anode electrode 105A. This insulating film has a plurality of openings. Drain/anode common electrode wiring 107A is formed on this insulating film, and drain/anode common electrode wiring 107A is electrically connected to drain electrode 104A, and drain/anode common electrode wiring 107A is electrically connected to anode electrode 105A through the openings.

The insulating film (not shown, corresponding to insulating layer 124 shown in FIG. 4) is also formed on drain electrode 104B and anode electrode 105B. This insulating film has the plurality of openings. Drain/anode common electrode wiring 107B is formed on this insulating film, and drain/anode common electrode wiring 107B is electrically connected to drain electrode 104B, and drain/anode common electrode wiring 107B is electrically connected to anode electrode 105B through the openings.

In transistor/diode group 108A, a first FET is comprised of source electrode 103A, drain electrode 104A, and gate electrode 101A sandwiched between source electrode 103A and drain electrode 104A, and a second FET is comprised of source electrode 103B, drain electrode 104B, and gate electrode 101B sandwiched between source electrode 103B and drain electrode 104B. Furthermore, a first Schottky diode is comprised of cathode electrode 106A and anode electrode 105A, and a second Schottky diode is comprised of cathode electrode 106A and anode electrode 105B. Furthermore, source electrode 103A is surrounded by gate electrode 101A, and source electrode 103B is surrounded by gate electrode 101B.

Transistor/diode group 108B includes gate electrodes 101B and 101C, source electrodes 103B and 103C, drain electrodes 104C and 104D, anode electrodes 105C and 105D, and cathode electrode 106B. Drain electrode 104C and anode electrode 105C are connected by drain/anode common electrode wiring 107C, and drain electrode 104D and anode electrode 105D are connected by drain/anode common electrode wiring 107D.

Between gate electrode 101B and gate electrode 101C, drain/anode common electrode wiring 107C, cathode electrode 106B, and drain/anode common electrode wiring 107D are sequentially disposed from a side of gate electrode 101B. In drain/anode common electrode wiring 107C, drain electrode 104C and anode electrode 105C are disposed, and in drain/anode common electrode wiring 107D, drain electrode 104D and anode electrode 105D are disposed. Drain electrode 104C and anode electrode 105C are disposed in drain/anode common electrode wiring 107C so that anode electrode 105C is closer to cathode electrode 106B. Furthermore, drain electrode 104D and anode electrode 105D are disposed in drain/anode common electrode wiring 107D so that anode electrode 105D is closer to cathode electrode 106B. Furthermore, the electrodes are arranged parallel to each other along their longitudinal direction.

The insulating film (not shown, corresponding to insulating layer 124 shown in FIG. 4) is formed on drain electrode 104C and anode electrode 105C. This insulating film has a plurality of openings. Drain/anode common electrode wiring 107C is formed on this insulating film, and drain/anode common electrode wiring 107C is electrically connected to drain electrode 104C, and drain/anode common electrode wiring 107C is electrically connected to anode electrode 105C through the openings.

The insulating film (not shown, corresponding to insulating layer 124 shown in FIG. 4) is also formed on drain electrode 104D and anode electrode 105D. This insulating film has a plurality of openings. Drain/anode common electrode wiring 107D is formed on this insulating film, and drain/anode common electrode wiring 107D is electrically connected to drain electrode 104D, and drain/anode common electrode wiring 107D is electrically connected to anode electrode 105D through the openings.

In transistor/diode group 108B, a third FET is comprised of source electrode 103B, drain electrode 104C, and gate electrode 101B sandwiched between source electrode 103B and drain electrode 104C, and a fourth FET is comprised of source electrode 103C, drain electrode 104D, and gate electrode 101C sandwiched between source electrode 103C and drain electrode 104D. Furthermore, a third Schottky diode is comprised of cathode electrode 106B and anode electrode 105C, and a fourth Schottky diode is comprised of cathode electrode 106B and anode electrode 105D. Furthermore, source electrode 103C is surrounded by gate electrode 101C.

In FIG. 1, reference signs are not applied to the parts corresponding to the first to fourth FETs and the first to fourth Schottky diodes for sake of simplicity.

Due to this configuration, the drain electrode and the anode electrode are connected in a shortest way in each of the first to fourth FETs and the first to fourth Schottky diodes, so that a parasitic inductance between the FET and the diode can be reduced.

Furthermore, according to the semiconductor apparatus in the present disclosure, one finger structure comprised of transistors and diodes such as transistor/diode groups 108A and 108B is periodically repeatedly disposed and integrated on a nitride semiconductor layer such as GaN layer 132 and AlGaN layer 131. Thus, the drain electrode of the transistor and the anode electrode of the diode can be connected in the shortest way with the electrode wiring, so that the parasitic inductance between the transistor and the diode can be reduced.

Furthermore, the semiconductor apparatus in FIG. 1 is comprised of two transistor/diode groups 108A and 108B, but the semiconductor apparatus according to the present disclosure is not always composed of the two transistor/diode groups. Three or more transistor/diode groups may be provided with the gate electrode and the source electrode being shared.

Furthermore, the electrodes of the transistor (such as gate electrodes 101A and 101C, and drain electrodes 104B and 104C), and electrodes of the diode (such as anode electrodes 105B and 105C, and cathode electrodes 106A and 106B) are disposed symmetrically with respect to the source electrode (such as 103B). Furthermore, the electrodes of the transistor (such as gate electrodes 101A and 101B, source electrodes 103A and 103B, and drain electrodes 104A and 104B), and electrodes of the diode (such as anode electrodes 105A and 105B) are disposed symmetrically with respect to the cathode electrode (such as 106A).

Furthermore, the gate electrodes are connected by one gate electrode wiring 102 in FIG. 1, but the nitride semiconductor apparatus according to the present disclosure does not always include the one gate electrode wiring. According to circumstances, the nitride semiconductor apparatus may include one or more gate electrode wirings.

Example 1 of First Exemplary Embodiment

Hereinafter, a semiconductor apparatus according to Example 1 of the first exemplary embodiment will be described with reference to FIG. 2.

The semiconductor apparatus according to Example 1 has a structure in which electrode wirings are provided in addition to the basic structure of the semiconductor apparatus shown in FIG. 1. The description will not be repeated for the part similar to the configuration shown in FIG. 1.

Figure 2:
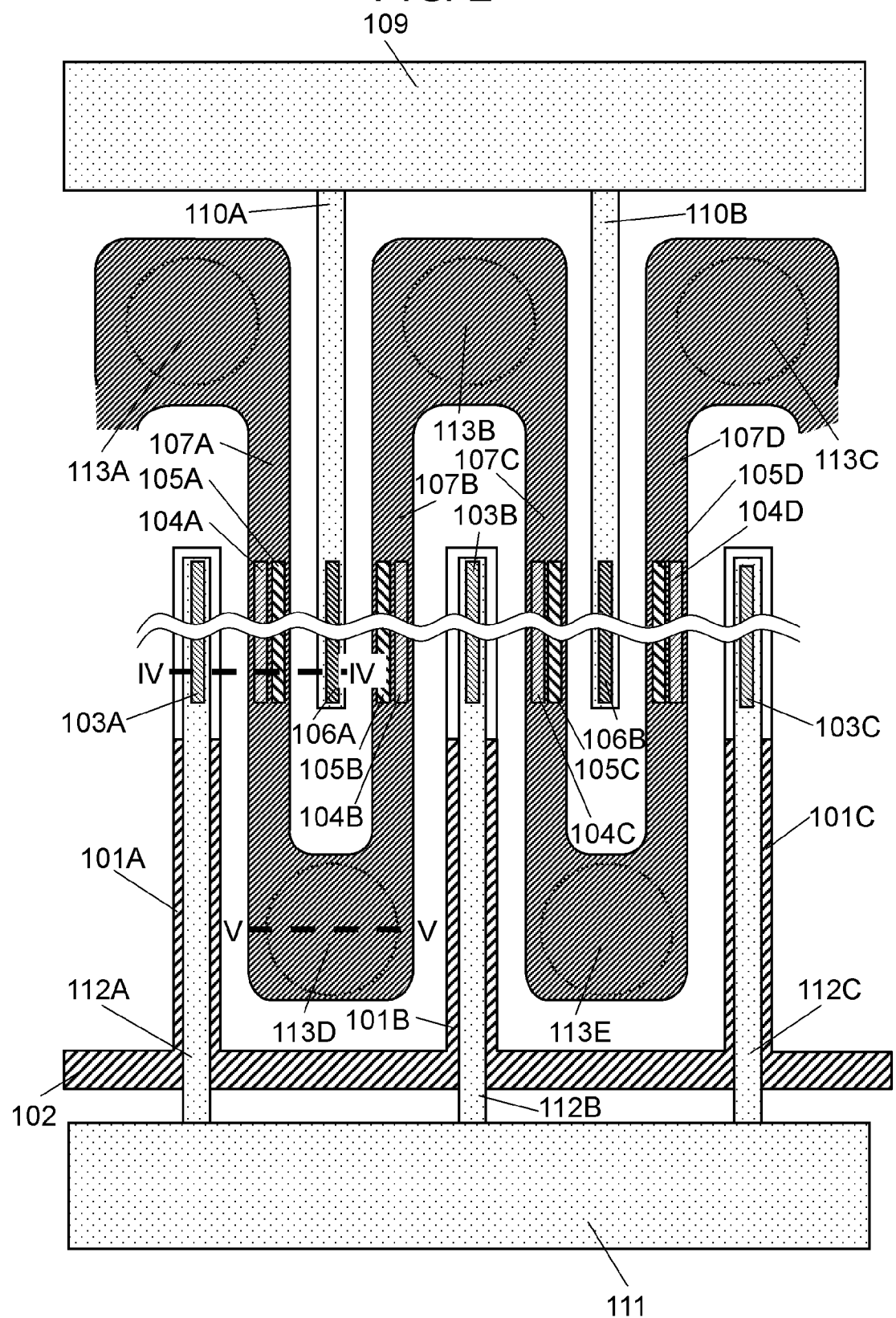
FIG. 2 is a layout diagram of a semiconductor apparatus according to Example 1 of the first exemplary embodiment.

In FIG. 2, cathode electrodes 106A and 106B are connected to cathode electrode pad 109 through cathode electrode wirings 110A and 110B, respectively. Source electrodes 103A, 103B, and 103C are connected to source electrode pad 111 through source electrode wirings 112A, 112B, and 112C, respectively. Drain/anode common electrode wirings 107A, 107B, 107C, and 107D penetrate the substrate and are connected to a rear surface electrode (not shown, corresponding to rear surface electrode 141 in FIG. 5) through via holes 113A, 113B, 113C, 113D, and 113E, respectively. The rear surface electrode serves as a common electrode pad of the drain and the anode. Thus, since the drain/anode common electrode pad is formed on a rear surface, only the cathode electrode pad is provided on a front surface of the apparatus as a high-voltage pad, so that gate electrode wiring 102 does not intersect with a high-voltage wiring. A gate electrode pad is not shown in an apparatus layout diagram in FIG. 2, but the gate electrode pad is formed on the front surface of the substrate, and connected to gate electrode wiring 102.

Gate electrodes 101A, 101B, and 101C, source electrodes 103A, 103B, and 103C, drain electrodes 104A, 104B, 104C, and 104D, anode electrodes 105A, 105B, 105C, and 105D, cathode electrodes 106A and 106B, drain/anode common electrode wirings 107A, 107B, 107C, and 107D, cathode electrode wirings 110A and 110B, and source electrode wirings 112A, 112B, and 112C are parallel to each other in the longitudinal direction. Hereinafter, this longitudinal direction is referred to as a vertical direction, and a direction perpendicular to the longitudinal direction is referred to as a lateral direction.

Via holes 113A, 113B, and 113C are arranged in a row in the lateral direction. Furthermore, via holes 113D and 113E are provided separately from the arrangement of via holes 113A to 113C, and arranged in a row in the lateral direction with respect to drain/anode common electrode wiring 107A.

Hereinafter, specific dimensions of the semiconductor apparatus having the nitride semiconductor layer will be shown as one example.

In transistor/diode group 108A, each of widths of gate electrodes 101A and 101B in the lateral direction (that is, electrode width) is 12 μm, and each of lengths of gate electrodes 101A and 101B in the longitudinal direction is 650 μm. Furthermore, each of widths of source electrodes 103A and 103B is 6 μm, and each of lengths of source electrodes 103A and 103B in the longitudinal direction is 500 μm.

Each of widths of drain electrodes 104A and 104B is 5 μm, and each of lengths of drain electrodes 104A and 104B in the longitudinal direction is 500 μm.

Each of widths of anode electrodes 105A and 105B is 4 μm, and each of lengths of anode electrodes 105A and 105B in the longitudinal direction is 500 μm.

A width of cathode electrode 106A is 8 μm, and a length of cathode electrode 106A in the longitudinal direction is 500 μm.

Specific dimensions in transistor/diode group 108B are similar to those in transistor/diode group 108A.

Each of widths of drain/anode common electrode wirings 107A, 107B, 107C, and 107D is 12 μm.

A width of gate electrode wiring 102 is 50 μm.

As for diameters of via holes 113A, 113B, 113C, 113D, and 113E, each diameter on the front surface is 50 μm, and each diameter on the rear surface is 30 μm.

A distance between the arrangement of via holes 113A to via holes 113C, and the arrangement of via holes 113D and via holes 113E is 550 μm. Furthermore, each of distances between via holes 113A, 113B, and 113C is 30 μm, and a distance between via holes 113D and via holes 113E is 35 μm.

Example 2 of First Exemplary Embodiment

Hereinafter, a semiconductor apparatus according to Example 2 of the first exemplary embodiment will be described with reference to FIG. 3.

The semiconductor apparatus according to Example 2 has a structure in which electrode wirings are provided in addition to the basic structure of the semiconductor apparatus shown in FIG. 1, similarly to Example 1. The description will not be repeated for the part similar to the configuration shown in FIG. 1.

Drain/anode common electrode wirings 107A, 107B, 107C, and 107D are connected to drain/anode common electrode pad 114. Source electrodes 103A, 103B, and 103C are connected to source electrode pad 115 through source electrode wirings 116A, 116B, and 116C, respectively. Cathode electrodes 106A and 106B are connected to via holes 118A and 118B through cathode electrode wirings 117A and 117B, respectively, penetrate the substrate, and reach a rear surface electrode. The rear surface electrode serves as a cathode electrode pad. Thus, since the cathode electrode pad is formed on the rear surface, only the drain/anode common electrode pad is provided on a front surface of the apparatus as a high-voltage pad, so that a gate electrode wiring does not intersect with the high-voltage wiring. A gate electrode pad is not shown in an apparatus layout diagram in FIG. 3, but the gate electrode pad is formed on the front surface of the substrate, and connected to gate electrode wiring 102 in FIG. 1.

Gate electrodes 101A, 101B, and 101C, source electrodes 103A, 103B, and 103C, drain electrodes 104A, 104B, 104C, and 104D, anode electrodes 105A, 105B, 105C, and 105D, cathode electrodes 106A and 106B, drain/anode common electrode wirings 107A, 107B, 107C, and 107D, cathode electrode wirings 117A and 117B, and source electrode wirings 116A, 116B, and 116C are parallel to each other in the longitudinal direction. Hereinafter, this longitudinal direction is referred to as a vertical direction, and a direction perpendicular to the longitudinal direction is referred to as a lateral direction.

Via holes 118A and 118B are arranged in the lateral direction.

Specific dimensions of the nitride semiconductor apparatus according to this example will be shown, but electrode widths and electrode lengths of gate electrode 101A to drain/anode common electrode wiring 107D in transistor/diode groups 108A and 108B are similar to those in Example 1.

As for diameters of via holes 118A and 118B, each diameter on the front surface is 50 μm, and each diameter on the rear surface is 30 μm.

A distance between via hole 118A and via hole 118B is 35 μm.

Cross-Sectional Structure of Semiconductor Apparatus According to Present Disclosure Hereinafter, the cross-sectional structure of the semiconductor apparatus according to Example 1 and Example 2 will be described with reference to FIGS. 4 and 5.

Figure 3:
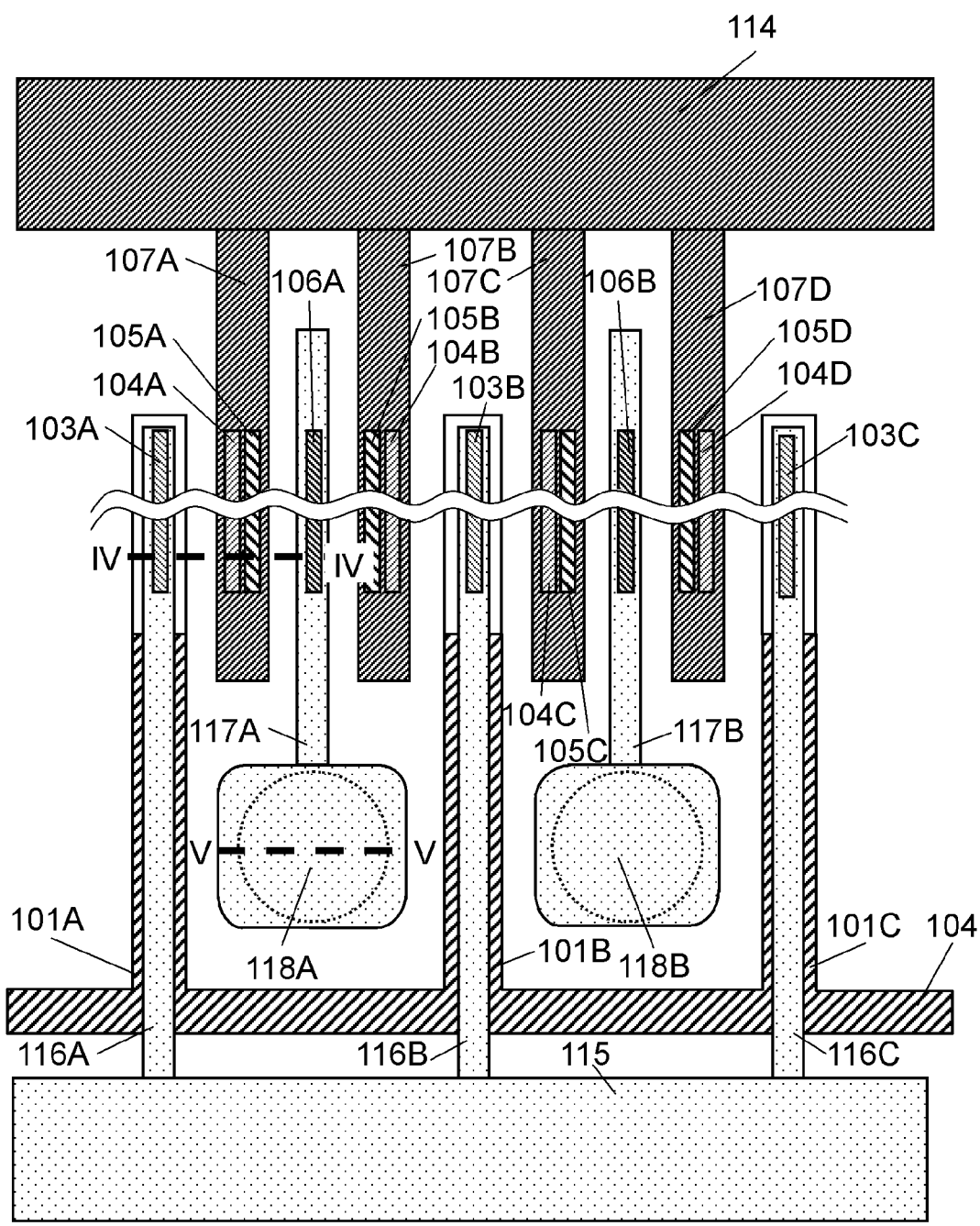
FIG. 3 is a layout diagram of a semiconductor apparatus according to Example 2 of the first exemplary embodiment.
Figure 4:
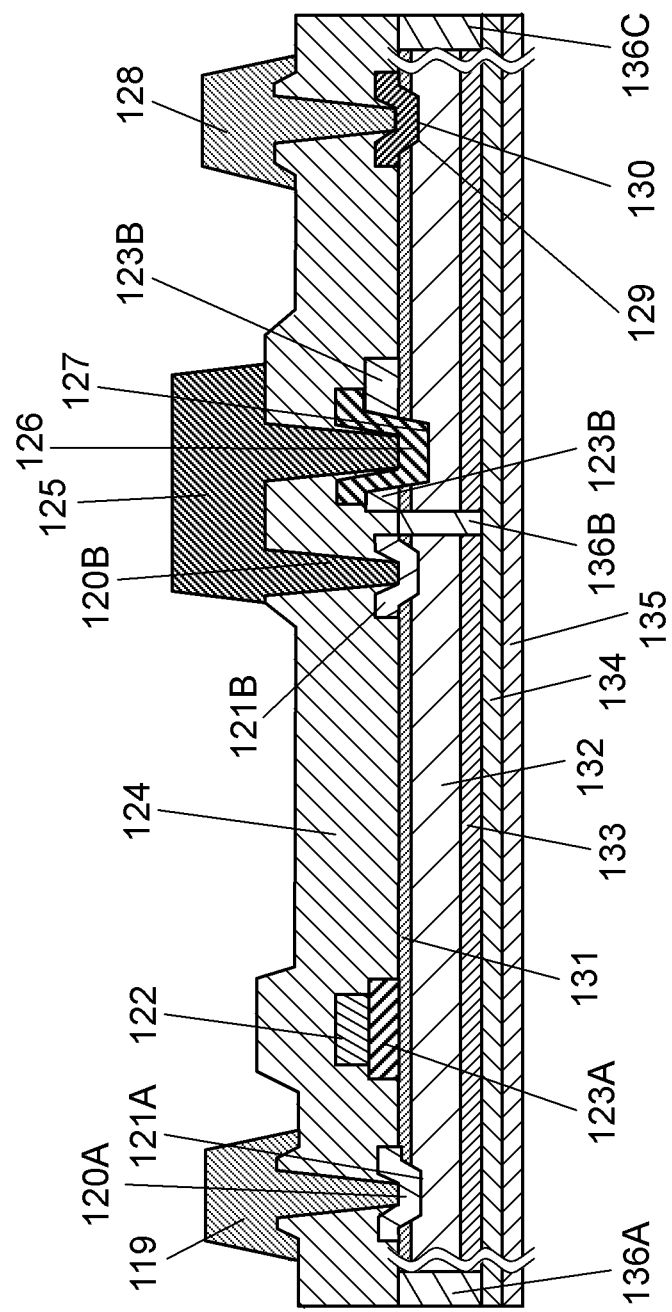
FIG. 4 is a cross-sectional view taken along lines IV-IV in FIGS. 2, 3, and 6.

FIG. 4 is a cross-sectional view taken along lines IV-IV in FIGS. 2 and 3. This apparatus has a structure in which the transistor and the diode are formed on GaN layer 132 and AlGaN layer 131 which are formed on substrate 134 having a main surface of (111) and made of Si, with buffer layer 133 interposed between GaN layer 132 and substrate 134.

Furthermore, buffer layer 133 is made of AlN, and has a thickness of 200 nm. Furthermore, GaN layer 132 has a thickness of 3 μm, and AlGaN layer 131 has a thickness of 15 nm and an Al composition of 20%. In addition, each of AlGaN layer 131, GaN layer 132, and buffer layer 133 is comprised of an undoped layer. Here, the undoped layer means a layer in which doping is not performed intentionally.

The transistor is provided such that p-type semiconductor layer 123A is formed on AlGaN layer 131, gate electrode 122 is formed on p-type semiconductor layer 123A, and source electrode 120A and drain electrode 120B are formed on AlGaN layer 131. Here, p-type semiconductor layer 123A is comprised of a p-type GaN layer doped with Mg and having a thickness of 200 nm. Furthermore, ohmic recess 121A and ohmic recess 121B are formed in AlGaN layer 131 just below source electrode 120A and drain electrode 120B, respectively. Each of ohmic recess 121A and ohmic recess 121B has a depth of 80 nm from a surface of AlGaN layer 131. When the ohmic recess is formed, the electrode can be directly in contact with a two dimensional electron gas (2 DEG), so that a contact area of the electrode can be reduced.

Gate electrode 122 is made of Pd, and each of source electrode 120A and drain electrode 120B has a stacked structure of Ti and Al. Gate electrode 122 and p-type semiconductor layer 123A are in ohmic contact with each other, and source electrode 120A and drain electrode 120B are also in ohmic contact with AlGaN layer 131.

Figure 5:
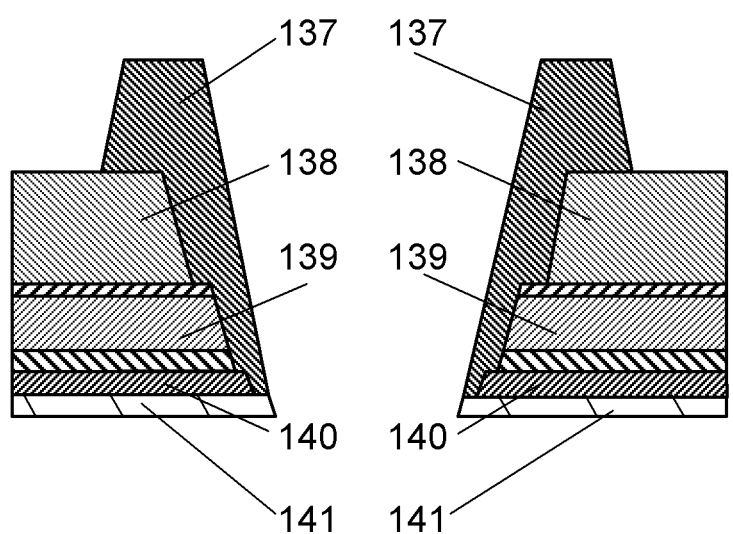
FIG. 5 is a cross-sectional view taken along lines V-V in FIGS. 2 and 3.

FIG. 5 is a cross-sectional view taken along lines V-V in FIGS. 2 and 3. The via hole is provided in element isolation region 139, and insulating layer 138 is formed on element isolation region 139. Rear surface electrode 141 is formed on a rear surface of substrate 140 and is connected to electrode wiring 137 through the via hole.

Furthermore, substrate 134 may be made of Si having a main surface of (001), sapphire, SiC, or spinel ($MgAlO_4$) other than Si having the main surface of (111).

Furthermore, p-type semiconductor layer 123A may be made of p-type AlGaN, p-type InGaN, or p-type nickel oxide (NiO) other than p-type GaN.

In addition, gate electrode 122 may be in ohmic contact with p-type semiconductor layer 123A, or may be in Schottky contact with p-type semiconductor layer 123A. Gate electrode 122 brought into ohmic contact may be made of Pd other than Ni, and gate electrode 122 brought into Schottky contact may be made of Ti or W.

Furthermore, ohmic recess 121A and ohmic recess 121B does not necessarily reach GaN layer 132, or the ohmic recess may not be formed. Each of source electrode 120A and drain electrode 120B may have a stacked structure of Hf and Al other than the stacked structure of Ti and Al.

Furthermore, the diode is comprised of anode electrode 126 and cathode electrode 129. Anode electrode 126 is formed in Schottky recess 127 which penetrates p-type semiconductor layer 123B and AlGaN layer 131 and reaches GaN layer 132. Here, p-type semiconductor layer 123B is comprised of a p-type GaN layer doped with Mg and having a thickness of 200 nm. Anode electrode 126 is electrically connected to GaN layer 132 with a Schottky contact, and made of Ni. Cathode electrode 129 is formed in ohmic recess 130, and has a stacked structure of Ti and Al. In Schottky recess 127, anode electrode 126 is formed on GaN layer 132 and AlGaN layer 131 with p-type semiconductor layer 123B interposed therebetween.

Furthermore, p-type semiconductor layer 123B may be made of p-type AlGaN, p-type InGaN, or p-type nickel oxide (NiO) other than p-type GaN.

Furthermore, p-type semiconductor layer 123B is not necessarily formed. In this case, anode electrode 126 may be formed in Schottky recess 127 which penetrates AlGaN layer 131 and reaches GaN layer 132 without p-type semiconductor layer 123B.

In addition, anode electrode 126 may be made of Pd other than Ni.

Furthermore, cathode electrode 129 may have a stacked structure of Hf and Al other than the stacked structure of Ti and Al.

Furthermore, ohmic recesses 121A, 121B, and 130 does not necessarily reach GaN layer 132. In addition, the ohmic recess is not necessarily formed.

Source electrode 120A and drain electrode 120B of the transistor, and anode electrode 126 and cathode electrode 129 of the diode are connected to source electrode wiring 119, drain/anode common electrode wiring 125, and cathode electrode wiring 128 through contact holes formed in insulating layer 124. Furthermore, rear surface electrode 135 is formed on a rear surface of substrate 134, and element isolation regions 136A, 136B, and 136C are formed by ion implantation, in a region other than an active region of the apparatus. These element isolation regions are formed to prevent a leak current between the transistor and the diode.

Example 3 of First Exemplary Embodiment

Figure 6:
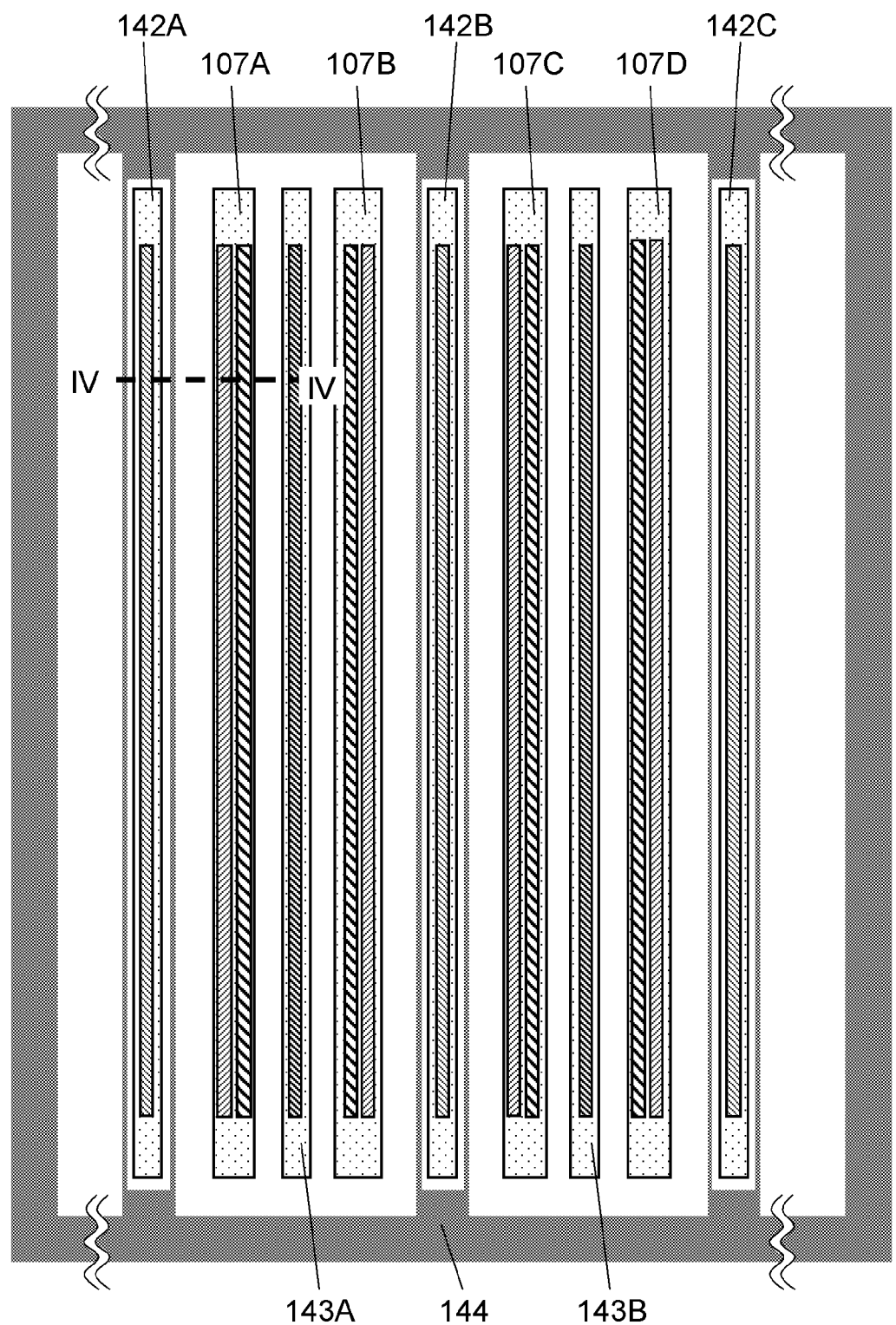
FIG. 6 is a layout diagram of a semiconductor apparatus according to Example 3 of the first exemplary embodiment.
Figure 7:
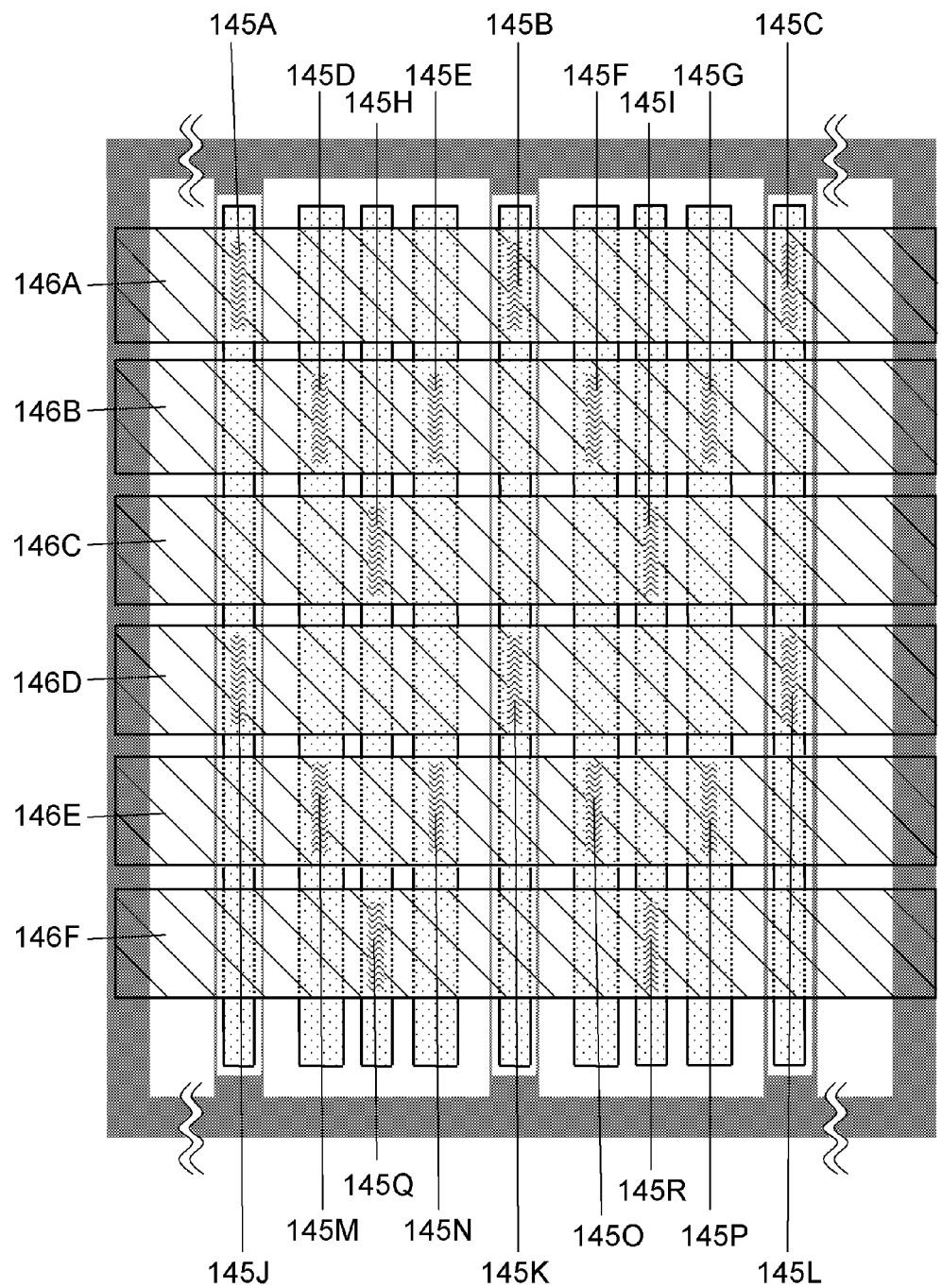
FIG. 7 is a layout diagram of a semiconductor apparatus according to Example 3 of the first exemplary embodiment.
Figure 8:
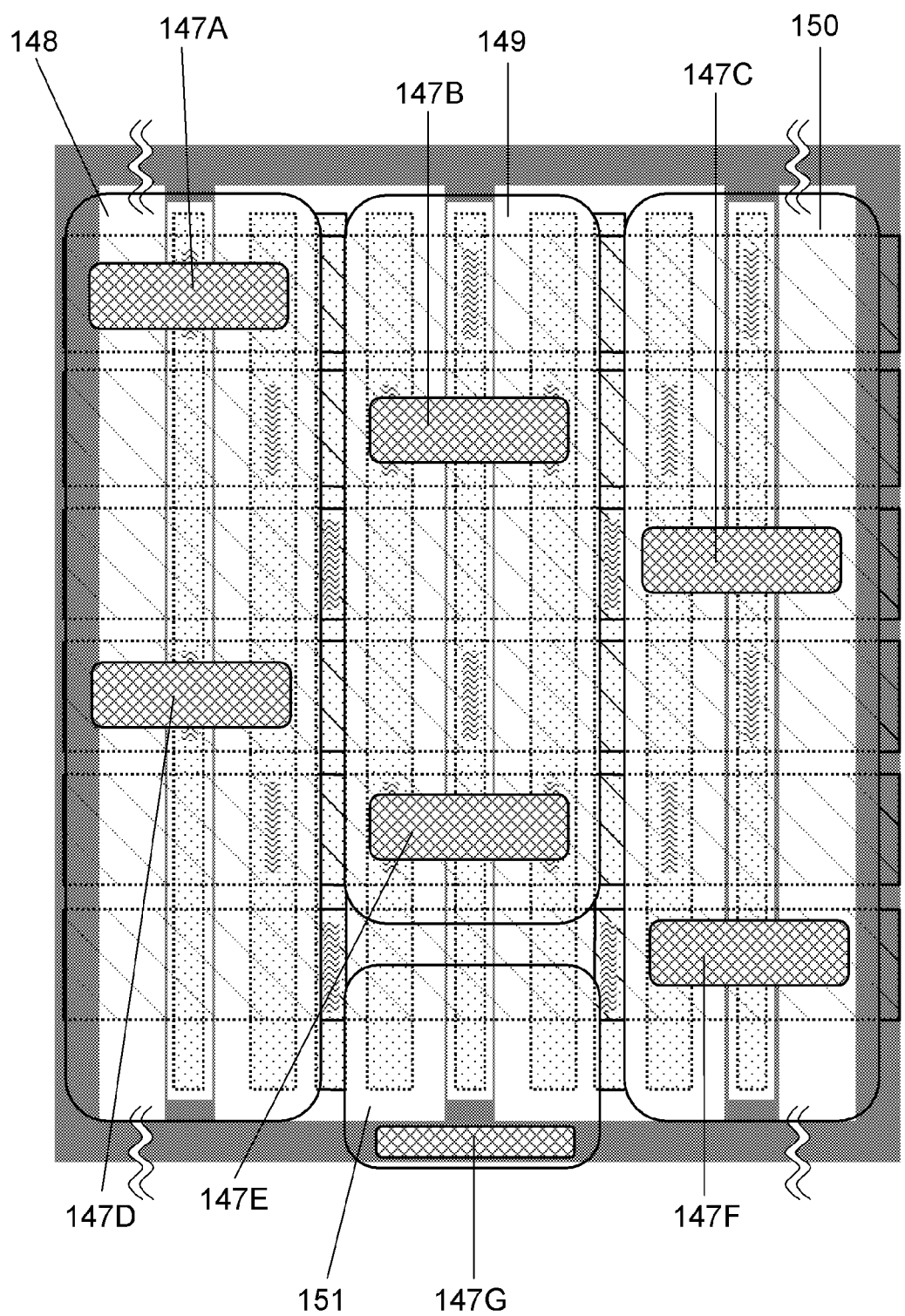
FIG. 8 is a layout diagram of a semiconductor apparatus according to Example 3 of the first exemplary embodiment.

Hereinafter, a semiconductor apparatus according to Example 3 of the first exemplary embodiment will be described with reference to FIGS. 6 to 8. In FIGS. 6 to 8, reference signs are occasionally omitted for sake of simplicity.

The semiconductor apparatus according to Example 3 shown in FIG. 6 has a structure in which electrode wirings are provided in addition to the basic structure of the semiconductor apparatus shown in FIG. 1. The description will not be repeated for the part similar to the configuration shown in FIG. 1.

In order to reduce a gate resistance, gate electrode wiring 144 is disposed to surround the apparatus, and both ends of the gate electrode are connected to gate electrode wiring 144. In FIG. 6, one region is surrounded by gate electrode wiring 144, but the semiconductor apparatus according to the present disclosure is not limited thereto, and a plurality of regions may be surrounded by gate electrode wiring 144. Furthermore, a cross-sectional structure taken along line Iv-Iv in FIG. 6 is similar to the cross-sectional structure shown in FIG. 4, but rear surface electrode 135 shown in FIG. 4 is not formed in Example 3.

FIG. 7 shows a structure in which an insulating layer is formed on the apparatus shown in FIG. 6, contact holes are formed in the insulating layer, and an electrode wiring on the first layer and an electrode wiring on the second layer are connected through the contact hole.

Source electrode wirings 142A, 142B, and 142C shown in FIG. 6 are connected to electrode wirings 146A and 146D in FIG. 7 through contact holes 145A, 145B, 145C, 145J, 145K, and 145L in FIG. 7.

Drain/anode common electrode wirings 107A, 107B, 107C, and 107D shown in FIG. 6 are connected to electrode wirings 146B and 146E in FIG. 7 through contact holes 145D, 145E, 145F, 145G, 145M, 145N, 145O, and 145P in FIG. 7.

Cathode electrode wirings 143A and 143B in FIG. 6 are connected to electrode wirings 146C and 146F in FIG. 7 through contact holes 145H, 145I, 145Q, and 145R in FIG. 7.

FIG. 8 shows a structure in which an insulating layer is formed on the wiring structure shown in FIG. 7, contact holes are formed in the insulating layer, and the wiring structure is connected to an electrode pad through the contact hole.

Electrode wiring 146A and electrode wiring 146D shown in FIG. 7 are connected to source electrode pad 148 in FIG. 8 through contact hole 147A and contact hole 147D in FIG. 8.

Electrode wiring 146B and electrode wiring 146E shown in FIG. 7 are connected to drain/anode common electrode wiring 149 in FIG. 8 through contact hole 147B and contact hole 147E in FIG. 8.

Electrode wiring 146C and electrode wiring 146F shown in FIG. 7 are connected to cathode electrode pad 150 in FIG. 8 through contact hole 147C and contact hole 147F in FIG. 8.

Gate electrode wiring 144 shown in FIG. 6 is connected to gate electrode pad 151 in FIG. 8 through contact hole 147G in FIG. 8.

As described above, the electrode pads are formed on an active region of the transistor and the diode, so that a chip size can be reduced, and there can be provided the same effect as in the basic structure of the semiconductor apparatus according to the first exemplary embodiment in FIG. 1.

Second Exemplary Embodiment

Figure 10:
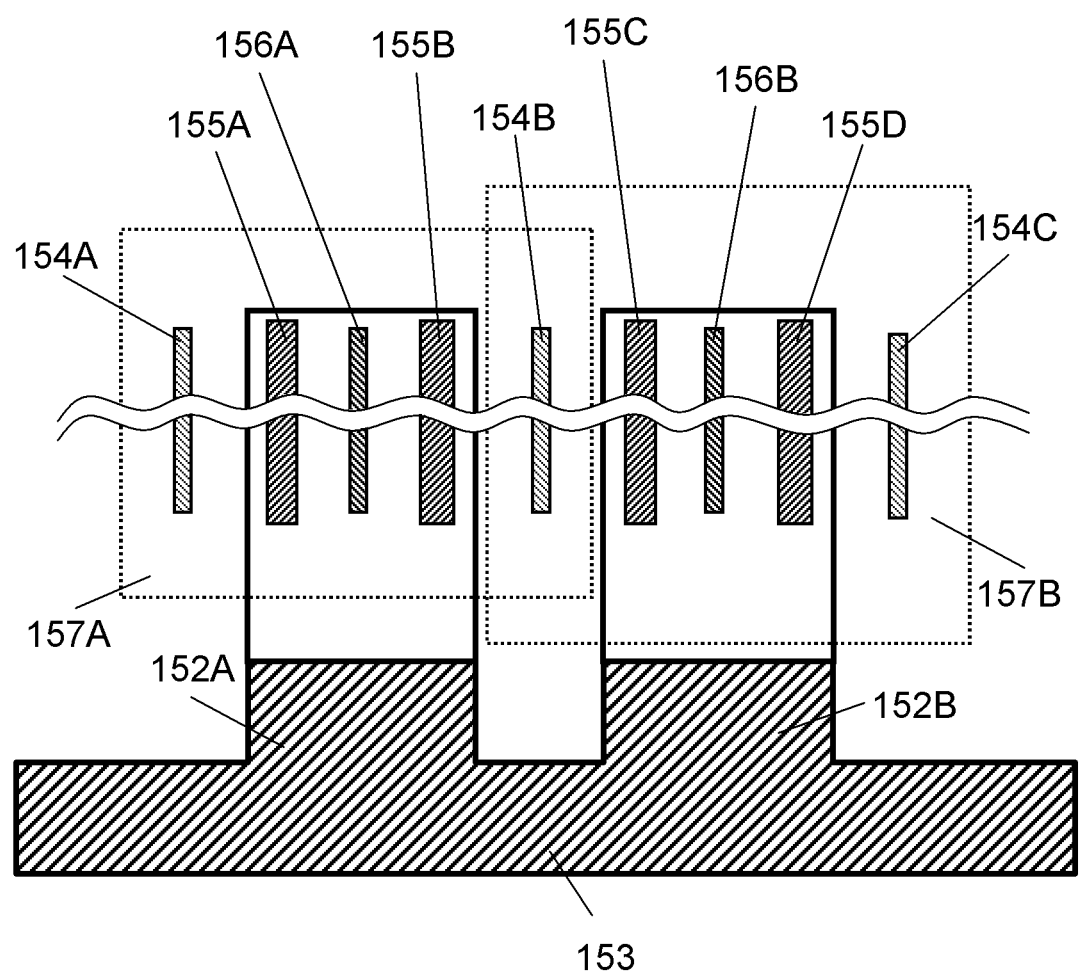
FIG. 10 is a layout diagram of a basic structure of a semiconductor apparatus according to Variant 1 of the second exemplary embodiment.
Figure 11:
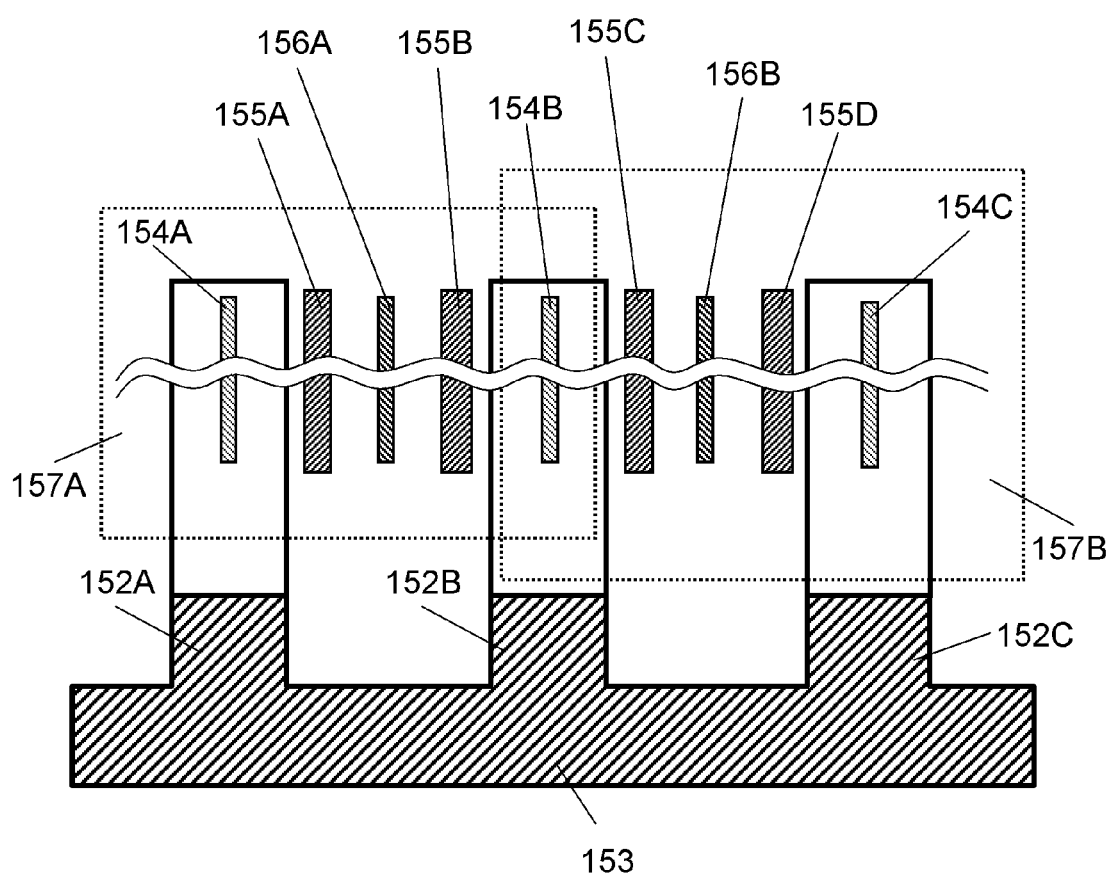
FIG. 11 is a layout diagram of a basic structure of a semiconductor apparatus according to Variant 2 of the second exemplary embodiment.
Figure 12:
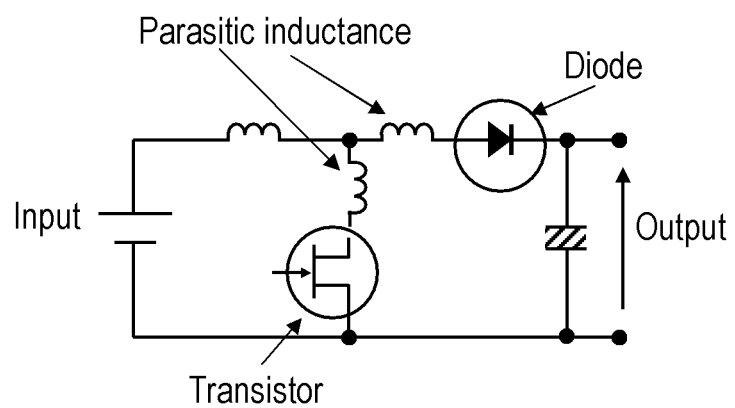
FIG. 12 is a circuit diagram of a semiconductor apparatus (step-up circuit) according to a conventional example.
Figure 13:
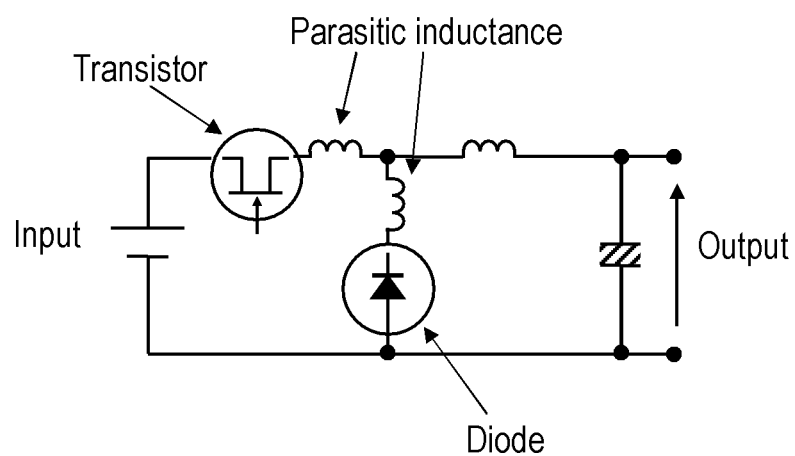
FIG. 13 is a circuit diagram of a semiconductor apparatus (step-down circuit) according to a conventional example.

Hereinafter, a semiconductor apparatus according to the second exemplary embodiment will be described with reference to FIGS. 9 to 11.

A basic structure of the semiconductor apparatus according to the present disclosure is an apparatus structure mainly used in a step-down circuit.

Figure 9:
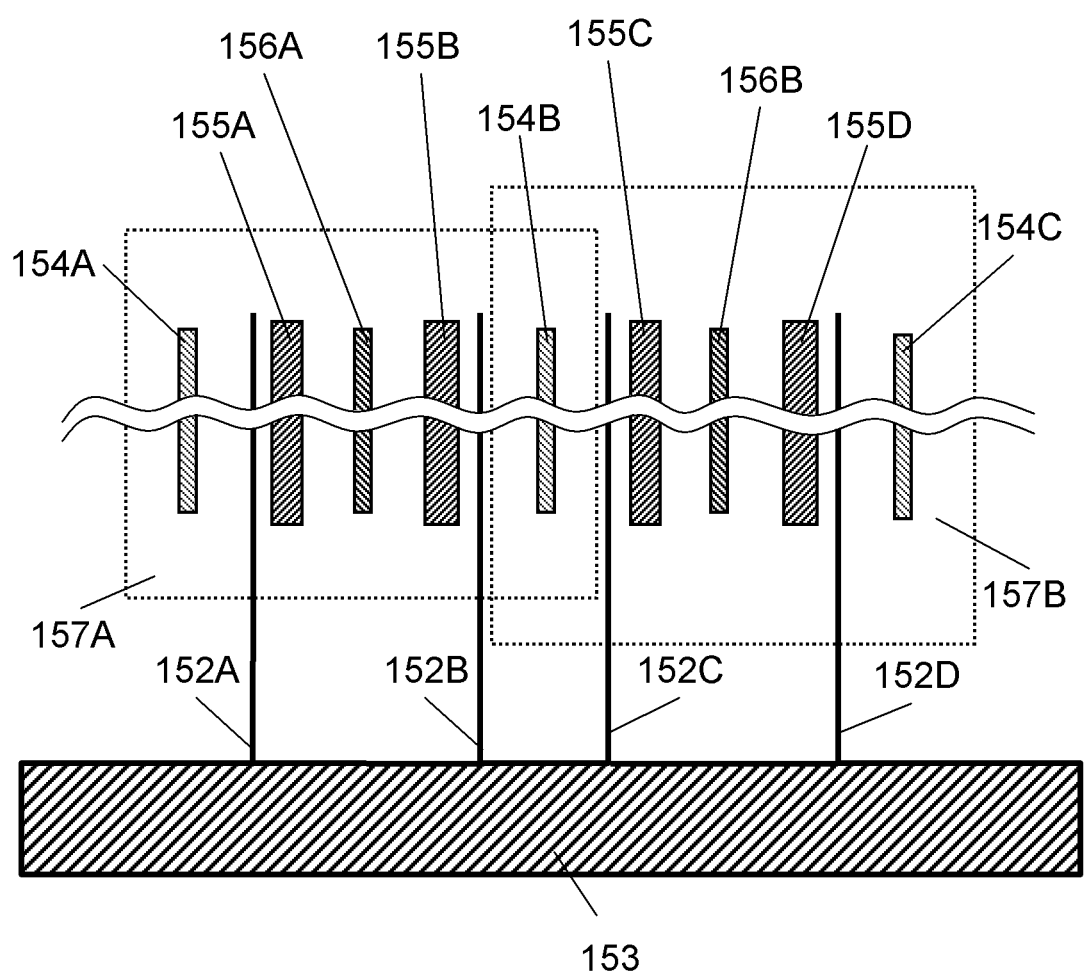
FIG. 9 is a layout diagram of a basic structure of a semiconductor apparatus according to a second exemplary embodiment.

As shown in FIG. 9, the basic structure of the semiconductor apparatus according to the second exemplary embodiment is comprised of transistor/diode group 157A and transistor/diode group 157B in which drain electrode 154B is shared.

Transistor/diode group 157A includes gate electrodes 152A and 152B, drain electrodes 154A and 154B, source/cathode common electrode 155A and 155B serving as ohmic electrodes, and anode electrode 156A serving as a Schottky electrode.

Transistor/diode group 157B includes gate electrodes 152C and 152D, drain electrodes 154B and 154C, source/cathode common electrodes 155C and 155D serving as ohmic electrodes, and anode electrode 156B serving as a Schottky electrode.

The basic structure of the nitride semiconductor apparatus according to this exemplary embodiment has the same finger structure as the basic structure shown in FIG. 1 except that a polarity of the diode and a polarity of the transistor are reversed. Therefore, this exemplary embodiment can have the same configuration as in each example of the first exemplary embodiment. Thus, descriptions of the examples are omitted here.

Variation 1 of Second Exemplary Embodiment

Hereinafter, a semiconductor apparatus according to Variation 1 of the second exemplary embodiment will be described with reference to FIG. 10.

A basic structure of the semiconductor apparatus according to Variation 1 differs from the basic structure shown in FIG. 9 in that source/cathode common electrodes 155A to 155D and anode electrodes 156A and 156B are surrounded by gate electrodes 152A and 152B. Due to this configuration, a leak current when the transistor is in the off-state can be reduced.

The basic structure of the semiconductor apparatus according to Variation 1 has the same finger structure as the basic structure shown in FIG. 1 except that a polarity of the diode and a polarity of the transistor are reversed, similarly to the basic structure in FIG. 9. Therefore, Variation 1 can have the same configuration as in each example of the first exemplary embodiment. Thus, descriptions of the examples are omitted here.

Variation 2 of Second Exemplary Embodiment

Hereinafter, a semiconductor apparatus according to Variation 2 of the second exemplary embodiment will be described with reference to FIG. 11.

A basic structure of the semiconductor apparatus according to Variation 2 differs from the basic structure shown in FIG. 9 in that drain electrodes 154A to 154C are surrounded by gate electrodes 152A to 152C, respectively. Due to this configuration, a leak current when the transistor is in the off-state can be reduced.

The basic structure of the semiconductor apparatus according to Variation 2 has the same finger structure as the basic structure shown in FIG. 1 except that a polarity of the diode and a polarity of the transistor are reversed, similarly to the basic structure in FIG. 9. Therefore, Variation 2 can have the same configuration as in each example of the first exemplary embodiment. Thus, descriptions of the examples are omitted here.

In the above, the exemplary embodiments and their variations have been described as examples of the technique in the present disclosure. Along with this, the accompanying drawings and the detailed descriptions have been provided.

Therefore, the components described in the accompanying drawings and the detailed descriptions include not only the component indispensable to solve the problem, but also, in order to describe the above technique, the component which is not indispensable to solve the problem. Therefore, the component which is not indispensable is not to be regarded as the indispensable component just because it is described in the accompanying drawings and the detailed descriptions.

Furthermore, as the above-described exemplary embodiments and the variations are provided to illustrate the technique in the present disclosure, the present disclosure is not limited to the described contents. Thus, as far as it does not deviate from the gist of the present disclosure, a configuration provided by adding various variations that the person skilled in the art come up with, to the exemplary embodiment, or a configuration provided by combining the components in the different exemplary embodiments is included in the scope of the present disclosure. Furthermore, modifications can be made within equivalent meaning and scope of the claims.

Furthermore, numeric values of each component for a width and a film thickness of the electrode shown in each of the exemplary embodiments, examples, and variations are only one example, and the present disclosure is not limited thereto.

The semiconductor apparatus according to the present disclosure may be applicable to a power factor correction (PFC) circuit which is used in a power supply circuit of a consumer device, and is useful in reducing the parasitic inductance between the transistor and the diode.

What is claimed is:

1. A semiconductor apparatus comprising:
a substrate;
a nitride semiconductor layer formed on the substrate;
a transistor formed on the nitride semiconductor layer, and including a source electrode, a gate electrode, and a drain electrode disposed in this order; and
a diode formed on the nitride semiconductor layer, and including an anode electrode and a cathode electrode disposed in this order,
wherein the semiconductor apparatus has a plurality of transistor/diode pairs in each of which the source electrode, the gate electrode, the drain electrode, the anode electrode, and the cathode electrode are disposed in this order, and the drain electrode of the transistor and the anode electrode of the diode are connected by a drain/anode common electrode wiring for serving as a common electrode, and
the plurality of transistor/diode pairs are disposed at regular intervals on the nitride semiconductor layer with the source electrode of the transistor or the cathode electrode of the diode being shared by two of the plurality of transistor/diode pairs adjacent to each other.

2. A semiconductor apparatus comprising:
a substrate;
a nitride semiconductor layer formed on the substrate;
a transistor formed on the nitride semiconductor layer, and including a source electrode, a gate electrode, and a drain electrode disposed in this order; and
a diode formed on the nitride semiconductor layer, and including an anode electrode and a cathode electrode disposed in this order,
wherein the semiconductor apparatus has a plurality of transistor/diode pairs in each of which the source electrode, the gate electrode, the drain electrode, the anode electrode, and the cathode electrode are disposed in this order, and the drain electrode of the transistor and the anode electrode of the diode are connected by a drain/anode common electrode wiring for serving as a common electrode, and
the source electrode, the gate electrode and the drain electrode of the transistor and the anode electrode and the cathode electrode of the diode are symmetrically disposed with respect to the source electrode or the cathode electrode.

3. The semiconductor apparatus according to claim 1, wherein the gate electrode of the transistor is disposed to surround the source electrode of the transistor.

4. The semiconductor apparatus according to claim 1, wherein the anode electrode of the diode is disposed to surround the cathode electrode of the diode.

5. The semiconductor apparatus according to claim 1, wherein a p-type semiconductor layer is provided between the nitride semiconductor layer and the gate electrode of the transistor.

6. The semiconductor apparatus according to claim 1, wherein a p-type semiconductor layer is provided between the nitride semiconductor layer and the anode electrode of the diode, and the nitride semiconductor layer and the anode electrode are electrically in contact with each other.

7. A semiconductor apparatus comprising:
a substrate;
a nitride semiconductor layer formed on the substrate;
a transistor formed on the nitride semiconductor layer, and including a source electrode, a gate electrode, and a drain electrode disposed in this order; and
a diode formed on the nitride semiconductor layer, and including an anode electrode and a cathode electrode disposed in this order,
wherein the semiconductor apparatus has a transistor/diode pair in which the source electrode, the gate electrode, the drain electrode, the anode electrode, and the cathode electrode are disposed in this order, and the drain electrode of the transistor and the anode electrode of the diode are connected by a drain/anode common electrode wiring for serving as a common electrode, the source electrode, the gate electrode, the drain/anode common electrode wiring, and the cathode electrode are respectively connected to a source electrode pad, a gate electrode pad, a drain/anode common electrode pad, and a cathode electrode pad, through respective electrode lead-out wirings, and at least one of the source electrode pad, the gate electrode pad, the drain/anode common electrode pad, and the cathode electrode pad is formed on a rear surface of the substrate through a hole penetrating from a front surface of the nitride semiconductor layer to the rear surface of the substrate.

8. The semiconductor apparatus according to claim 7, wherein at least one of the drain/anode common electrode pad and the cathode electrode pad is formed on the rear surface of the substrate.

9. A semiconductor apparatus comprising:

a substrate;

a nitride semiconductor layer formed on the substrate;

a transistor formed on the nitride semiconductor layer, and including a source electrode, a gate electrode, and a drain electrode disposed in this order; and a diode formed on the nitride semiconductor layer, and including an anode electrode and a cathode electrode disposed in this order, wherein the semiconductor apparatus has a transistor/diode pair in which the source electrode, the gate electrode, the drain electrode, the anode electrode, and the cathode electrode are disposed in this order, and the drain electrode of the transistor and the anode electrode of the diode are connected by a drain/anode common electrode wiring for serving as a common electrode, a first insulating layer, a wiring layer, and a second insulating layer are stacked in this order on an active region of the transistor and the diode that include the source electrode, the gate electrode, the drain/anode common electrode wiring, and the cathode electrode, each of the first insulating layer and the second insulating layer has a plurality of openings, the source electrode, the gate electrode, the drain/anode common electrode wiring, and the cathode electrode are electrically connected to a source electrode wiring layer, a gate electrode wiring layer, a drain/anode common electrode wiring layer, and a cathode electrode wiring layer, each layer formed in the wiring layer, respectively through the plurality of openings formed in the first insulating layer, and the respective wiring layers formed in the wiring layer are electrically connected to a source electrode pad, a gate electrode pad, a drain/anode common electrode pad, and a cathode electrode, each pad formed on the second insulating layer, respectively through the plurality of openings formed in the second insulating layer.

10. The semiconductor apparatus according to claim 1, wherein at least one of the source electrode, the gate electrode, the drain/anode common electrode wiring, and the cathode electrode is connected to an electrode pad formed on a rear surface of the substrate, through a hole penetrating from a front surface of the nitride semiconductor layer to the rear surface of the substrate, a first insulating layer, a plurality of wiring layers, and a second insulating layer are stacked in this order on the other electrodes, each of the first insulating layer and the second insulating layer has a plurality of openings, the other electrodes are electrically connected to the respective wiring layers through the plurality of openings formed in the first insulating layer, and the respective wiring layers are electrically connected to electrode pads formed on the second insulating layer through the plurality of openings formed in the second insulating layer.

11. A semiconductor apparatus comprising:

a substrate;

a nitride semiconductor layer formed on the substrate;

a transistor formed on the nitride semiconductor layer, and including a drain electrode, a gate electrode, and a source electrode disposed in this order; and a diode formed on the nitride semiconductor layer, and including a cathode electrode and an anode electrode disposed in this order, wherein the semiconductor apparatus has a plurality of transistor/diode pairs in each of which the source electrode of the transistor and the cathode electrode of the diode serve as a source/cathode common electrode, and the drain electrode, the gate electrode, the source/cathode common electrode, and the anode electrode are disposed in this order, and the plurality of transistor/diode pairs are disposed at regular intervals on the nitride semiconductor layer with the drain electrode of the transistor or the anode electrode of the diode being shared by two of the plurality of transistor/diode pairs adjacent to each other.

12. A semiconductor apparatus comprising:

a substrate;

a nitride semiconductor layer formed on the substrate;

a transistor formed on the nitride semiconductor layer, and including a drain electrode, a gate electrode, and a source electrode disposed in this order; and a diode formed on the nitride semiconductor layer, and including a cathode electrode and an anode electrode disposed in this order, wherein the semiconductor apparatus has a plurality of transistor/diode pairs in each of which the source electrode of the transistor and the cathode electrode of the diode serve as a source/cathode common electrode, and the drain electrode, the gate electrode, the source/cathode common electrode, and the anode electrode are disposed in this order, and the electrodes of the transistor and the electrodes of the diode are symmetrically disposed with respect to the drain electrode or the anode electrode.

13. The semiconductor apparatus according to claim 11, wherein the gate electrode of the transistor is disposed to surround the drain electrode of the transistor.

14. The semiconductor apparatus according to claim 11, wherein a p-type semiconductor layer is provided between the nitride semiconductor layer and the gate electrode of the transistor.

15. The semiconductor apparatus according to claim 11, wherein a p-type semiconductor layer is provided between the nitride semiconductor layer and the anode electrode of the diode, and the nitride semiconductor layer and the anode electrode are electrically in contact with each other.

16. A semiconductor apparatus comprising:

a substrate;

a nitride semiconductor layer formed on the substrate;

a transistor formed on the nitride semiconductor layer, and including a drain electrode, a gate electrode, and a source electrode disposed in this order; and a diode formed on the nitride semiconductor layer, and including a cathode electrode and an anode electrode disposed in this order, wherein the semiconductor apparatus has a transistor/diode pair in which the source electrode of the transistor and the cathode electrode of the diode serve as a source/cathode common electrode, and the drain electrode, the gate electrode, the source/cathode common electrode, and the anode electrode are disposed in this order, the drain electrode, the gate electrode, the source/cathode common electrode, and the anode electrode are respectively connected to a drain electrode pad, a gate electrode pad, a source/cathode common electrode pad, and an anode electrode pad, through respective electrode lead-out wirings, and at least one of the drain electrode pad, the gate electrode pad, the source/cathode common electrode pad, and the anode electrode pad is formed on a rear surface of the substrate through a hole penetrating from a front surface of the nitride semiconductor layer to the rear surface of the substrate.

17. A semiconductor apparatus comprising:
a substrate;
a nitride semiconductor layer formed on the substrate;
a transistor formed on the nitride semiconductor layer, and including a drain electrode, a gate electrode, and a source electrode disposed in this order; and
a diode formed on the nitride semiconductor layer, and including a cathode electrode and an anode electrode disposed in this order, wherein the semiconductor apparatus has a transistor/diode pair in which the source electrode of the transistor and the cathode electrode of the diode serve as a source/cathode common electrode, and the drain electrode, the gate electrode, the source/cathode common electrode, and the anode electrode are disposed in this order, a first insulating layer, a wiring layer, and a second insulating layer are stacked in this order on an active region of the transistor and the diode including the drain electrode, the gate electrode, the source/cathode common electrode, and the anode electrode, each of the first insulating layer and the second insulating layer has a plurality of openings, the drain electrode, the gate electrode, the source/cathode common electrode, and the anode electrode are electrically connected to a drain electrode wiring layer, a gate electrode wiring layer, a source/cathode common electrode wiring layer, and an anode electrode wiring layer, each layer formed in the wiring layer, respectively through the plurality of openings formed in the first insulating layer, and the respective wiring layers formed in the wiring layer are electrically connected to a drain electrode pad, a gate electrode pad, a source/cathode common electrode pad, and an anode electrode pad, each pad formed on the second insulating layer, respectively through the plurality of openings formed in the second insulating layer.

18. The semiconductor apparatus according to claim 11, wherein at least one electrode of the drain electrode, the gate electrode, the source/cathode common electrode, and the anode electrode is connected to an electrode pad formed on a rear surface of the substrate, through a hole penetrating from a front surface of the nitride semiconductor layer to the rear surface of the substrate, a first insulating layer, a plurality of wiring layers, and a second insulating layer are stacked in this order on the other electrodes, each of the first insulating layer and the second insulating layer has a plurality of openings, the other electrodes are electrically connected to the respective wiring layers through the plurality of openings formed in the first insulating layer, and the respective wiring layers are electrically connected to electrode pads formed on the second insulating layer through the plurality of openings formed in the second insulating layer.

19. The semiconductor apparatus according to claim 1, wherein the source electrode, the gate electrode, the drain/anode common electrode wiring, and the cathode electrode are respectively connected to a source electrode pad, a gate electrode pad, a drain/anode common electrode pad, and a cathode electrode pad, through respective electrode lead-out wirings, and at least one of the source electrode pad, the gate electrode pad, the drain/anode common electrode pad, and the cathode electrode pad is formed on a rear surface of the substrate through a hole penetrating from a front surface of the nitride semiconductor layer to the rear surface of the substrate.

20. The semiconductor apparatus according to claim 11, wherein the drain electrode, the gate electrode, the source/cathode common electrode, and the anode electrode are respectively connected to a drain electrode pad, a gate electrode pad, a source/cathode common electrode pad, and an anode electrode pad, through respective electrode lead-out wirings, and at least one of the drain electrode pad, the gate electrode pad, the source/cathode common electrode pad, and the anode electrode pad is formed on a rear surface of the substrate through a hole penetrating from a front surface of the nitride semiconductor layer to the rear surface of the substrate.

* * * * *